United States Patent
Tokuyama et al.

[11] Patent Number: 5,959,330
[45] Date of Patent: Sep. 28, 1999

[54] SEMICONDUCTOR DEVICE AND METHOD OF MANUFACTURING SAME

[75] Inventors: Norihiro Tokuyama, Kasaoka; Toshinori Ohmi, Higashiosaka; Alberto Oscar Adan, Ikoma, all of Japan

[73] Assignee: Sharp Kabushiki Kaisha, Osaka, Japan

[21] Appl. No.: 08/904,557

[22] Filed: Aug. 4, 1997

[30] Foreign Application Priority Data

Aug. 5, 1996 [JP] Japan ................................. 8-205533

[51] Int. Cl.⁶ ................................................... H01L 29/76
[52] U.S. Cl. ........................ 257/345; 257/409; 438/290; 438/298
[58] Field of Search ................................. 257/297, 345, 257/336, 344, 408, 409; 438/217, 218, 290, 298

[56] References Cited

U.S. PATENT DOCUMENTS 5,623,154  4/1997  Murakami et al. ...................... 257/345

FOREIGN PATENT DOCUMENTS

| 62-54466 | 10/1987 | Japan | 257/345 |
| 1-194346 | 8/1989 | Japan | 257/297 |
| 3-142856 | 6/1991 | Japan | 257/345 |
| 3-257846 | 11/1991 | Japan | 257/345 |
| 4-22170 | 1/1992 | Japan | 257/345 |
| 5-218194 | 8/1993 | Japan | 257/345 |
| 5-283519 | 10/1993 | Japan | 257/345 |
| 6-5588 | 1/1994 | Japan | 257/345 |

*Primary Examiner*—Donald Monin
*Attorney, Agent, or Firm*—Nixon & Vanderhye P.C.

[57] ABSTRACT

After a field oxide film is formed on a P-type semiconductor substrate, ion implantation of boron is carried out with respect to a whole surface of the substrate so that a channel stopper layer is formed. Then, a MOS FET is formed in an active region of the semiconductor substrate. Subsequently, ion implantation of phosphorus is carried out, by using a gate electrode of the MOS FET and the field oxide film as a mask, so that impurity layers which have the same type of conductivity as that of the channel stopper layer and has a concentration lower than that of the channel stopper layer are formed right under the source/drain regions of the MOS FET between the source/drain regions and the channel stopper layer.

14 Claims, 7 Drawing Sheets

SEMICONDUCTOR DEVICE AND METHOD OF MANUFACTURING SAME

FIELD OF THE INVENTION

The present invention relates to a manufacturing method of a semiconductor device.

BACKGROUND OF THE INVENTION

Recently, a method of implanting ions through a field oxidation film to underneath is widely used for forming a channel stopper layer under the field oxidation film (this ion implantation for forming the channel stopper layer is hereinafter referred to as channel stopper implantation) relating to element isolation in a manufacturing process of a metal oxide semiconductor field effect transistor (MOS FET). The reason is that this method has effects of suppressing a narrow channel effect and improving junction breakdown strength, as compared with a method of carrying out the channel stopper implantation before forming the field oxide film.

As to the channel stopper implantation after forming the field oxide film, various methods have been proposed. For example, the Japanese Publication for Laid-Open Patent Application No. 3-257846/1991 (Tokukaihei No. 3-257846) and the Japanese Publication for Laid-Open Patent Application No. 4-22170/1992 (Tokukaihei No. 4-22170) disclose a method of using a resist mask so that impurities would not enter an active region. The Japanese Publications for Laid-Open Patent Applications No. 5-283519/1993 (Tokukaihei No. 5-283519), No. 5-218194/1993 (Tokukaihei No. 5-218194), and No. 6-5588/1994 (Tokukaihei No. 6-5588) disclose a method of carrying out the ion implantation with an oxidation resistance mask remaining, which has been used during the formation of the field oxide film, so as to prevent impurities from entering an active region.

Besides, there has been proposed another method which is disclosed by the Japanese Publication for Laid-Open Patent Application No. 3-142856/1991 (Tokukaihei No. 3-142856). According to the method, a field oxide film is formed thicker than an intended thickness, and channel stopper implantation is carried out with a high energy. Thereafter, the field oxide film is etched to the intended film thickness. In this case, even though impurities enter an active region, a position at which they are implanted is considerably deep in the active region. Therefore, it is possible to suppress an increase in a junction capacitance (junction capacitance in a direction of an interface between a lower part of a diffusion layer and a substrate).

The method used here, in which the resist mask is used, requires precision in mask alignment. Therefore, it is not suitable for micromachinning. As to the method of ion implantation with an oxidation resistant mask remaining is not practical, since a thick oxidation resistant mask, that is required in the case where an implantation energy is high, causes stress on the substrate during thermal oxidation. On the other hand, a thinner field oxide film, that is required in the case where the implantation energy is relatively low, makes it difficult to set a level of the implantation energy and a film thickness of the oxide film so that they match each other.

Therefore, a method on the premise that the impurities enter the active region is practical. The following description will explain a conventional technique on the premise that the impurities enter the active region, which is disclosed by the Japanese Publication for laid-Open Patent Application No. 3-142856/1991 (Tokukaihei No. 3-142856).

To start with, a pad oxide film 22 and a silicon nitride film 23 are deposited on a P-type silicon substrate (or P-type well) 21, and the silicon nitride film 23 is opened so as to form an element isolating region, in which a field oxide film 24 is formed (see FIG. 7($a$)). Herein, the field oxide film 24 is formed thicker than an intended thickness of the film. For example, in the case where the intended thickness is 3000 Å, the field oxide film 24 is formed 4000 Å thick.

Figure 7A:
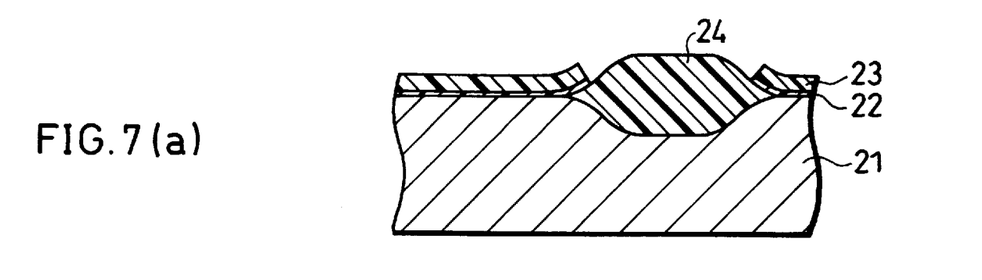
FIGS. 7(a) through 7(d) are cross-sectional views illustrating a process of manufacturing a semiconductor device by prior art.
Figure 7B:
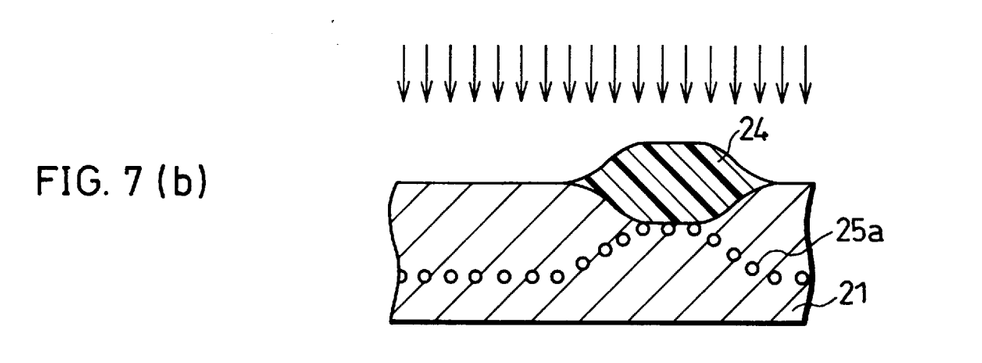

Next, the pad oxide film 22 and the silicon nitride film 23 are removed. Ions of boron are implanted by the dose quantity of about $4\times10^{12}$ cm$^{-2}$ through the field oxide film 24. Herein, the implantation is performed at an energy of about 150 keV when the thickness of the field oxide film 24 is about 4000 Å (see FIG. 7($b$)). Note that 25$a$ represents the implanted boron ions.

Figure 7C:
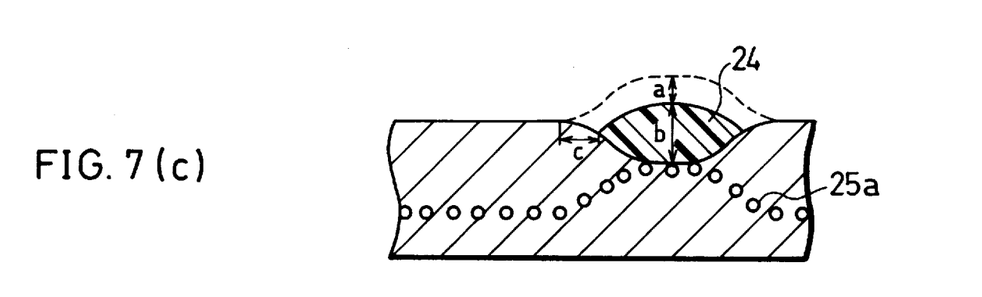

Then, the field oxide film 24 is etched back to the intended film thickness by wet etching with hydrofluoric acid or by RIE (reactive ion etching). Note that "a" in FIG. 7($c$) represents a thickness of an etched-back portion of the field oxide film 24, which is about 1000 Å, and "b" represents a thickness of the field oxide film 24 after the etching back, which is about 3000 Å.

Figure 7D:
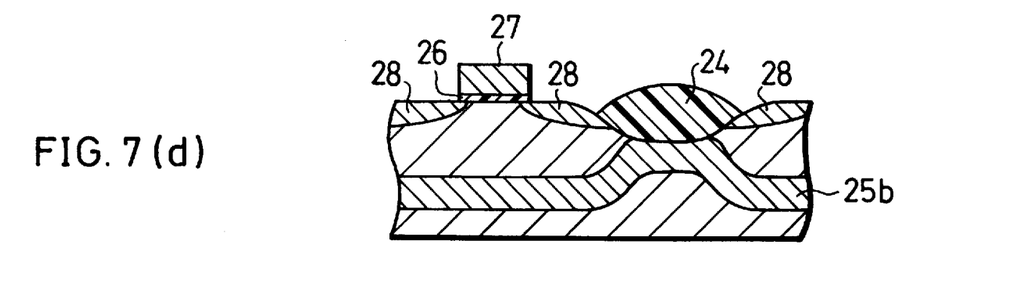

Subsequently, a gate oxide film 26 and a gate electrode 27 are formed, and thereafter, N$^+$ diffusion layers 28 to serve as source/drain regions are formed (see FIG. 7($d$)). Note that as shown in FIG. 7($d$), the boron ions 25$a$ implanted through the channel stopper implantation are diffused by thermal annealings in the process of forming the MOS FET (for example, a thermal annealing for activating the N$^+$ diffusion layer 28), thereby forming an impurity layer (a boron implantation layer serving as a channel stopper layer) 25$b$ which spreads to some extent.

In addition, as illustrated in FIG. 7($d$), the boron implantation layer 25$b$ serving as the channel stopper layer is formed in a considerably deep part in the active region (where the MOS FET is formed). Therefore, problems such as an increase in the junction capacitance (junction capacitance in a direction of an interface between a lower part of a diffusion layer and a substrate) can be solved.

However, according to the aforementioned conventional manufacturing method, the channel stopper implantation at a high energy is applied with the field oxide film 24 formed thicker, and thereafter the field oxide film 24 is etched back to the intended thickness. This causes the field oxide film 24 to be etched back not only in a perpendicular direction but also in lateral directions, resulting in dimensional changes thereof. In FIG. 7($c$), "c" represents a degree of the etching in lateral directions.

Therefore, in the case where the dimensional change varies, it causes a gate width of the MOS FET to vary, thereby causing characteristics of the MOS FET to vary. Moreover, since a width of the element isolating region varies with the dimensional changes, it is necessary to form the field oxide film 24 larger in size than the intended size, fearing that the field oxide film 24 might be excessively etched back. In any case, as long as the dimensional changes occur as a result of the etching back, the aforementioned method is not suitable for micromachinning.

On the other hand, in nonvolatile memories such as EEPROM (electrically erasable programmable read only memory), a high voltage is applied also to the diffusion layer upon writing or erasing data. Therefore, source/drain breakdown strength (junction breakdown strength and punch-through breakdown strength) and element isolation breakdown strength (field inversion voltage) should be increased. At present, breakdown strength of not less than 15 V is required. In order to increase the element isolation breakdown strength, it is necessary to thicken the field oxide film or to increase the implantation dose of the impurity for formation of the channel stopper layer, but as the field oxide film becomes thicker, a bird's peak tends to get longer, thereby increasing the dimensional changes.

Moreover, in the case where the channel stopper layer is formed deep in a channel region so that the transistor is less affected, it is required, in forming a microscopic transistor, to further carry out additional channel implantation and the like.

SUMMARY OF THE INVENTION

The object of the present invention is to provide a manufacturing method of a semiconductor device, which has the following characteristics: an increase in a junction capacitance and changes in size of a field oxide film are avoided, and the semiconductor device manufactured by the method has stable element isolating region and MOS FET.

To achieve the above-described object, a semiconductor device manufacturing method of the present invention is characterized in comprising the steps of (a) forming a field oxide film either on a first-conductivity-type semiconductor substrate or on a first-conductivity-type well, (b) carrying out ion implantation of a first-conductivity-type impurity with respect to a whole surface so as to form a channel stopper layer under the field oxide film, and thereafter, forming a MOS FET having a gate electrode, a source region, and a drain region in an active region either in the semiconductor substrate or in the well, and (c) carrying out ion implantation of a second-conductivity-type impurity, by using the gate electrode of the MOS FET and the field oxide film as a mask, so that impurity layers having the same type of conductivity as that of the channel stopper layer and a concentration lower than that of the channel stopper layer are formed right under the source region and the drain region of the MOS FET between the source and drain regions and the channel stopper layer.

According to the foregoing method, the ion implantation of the first-conductivity-type impurity is carried out through the field oxide film so that the channel stopper layer is formed, and thereafter, unlike the conventional cases, etching back of the field oxide film for adjusting the thickness of the field oxide film to a desired thickness is not carried out. Therefore, dimensional changes do not occur to the field oxide film. Therefore, a gate width of the MOS FET does not vary, thereby causing no irregularities in characteristics of the MOS FET. Besides, the foregoing method does not causes a change in the size of the field oxide, hence allowing the semiconductor device to be microminiaturized.

Furthermore, since influences of the impurity concentration in the channel stopper layer is reduced by using the impurity layers formed right under the source/drain regions by the implantation of the impurity with the same type of conductivity as the channel stopper layer at a lower concentration than that of the channel stopper layer formed in the active region, the junction capacitance just under the source/drain regions can be reduced.

For a fuller understanding of the nature and advantages of the invention, reference should be made to the ensuing detailed description taken in conjunction with the accompanying drawings.

DESCRIPTION OF THE PREFERRED EMBODIMENTS

The following description will explain a method for manufacturing a semiconductor device in accordance with an embodiment of the present invention, while referring to FIGS. 1(a) through 1(d). Note that 1 is a P-type silicon substrate as a first-conductivity-type semiconductor substrate (or, a P-type well as a first-conductivity-type well), 2 is a pad oxide film, 3 is a silicon nitride film, 4 is a field oxide film, 5a is implanted boron (first-conductivity-type impurity), 5b is a boron implantation layer after thermal annealing, 6 is a gate oxide film, 7 is a gate electrode, 8 is an N-type diffusion layer (source/drain region), and 9 is a phosphorus implantation layer (an impurity layer).

Figure 1:
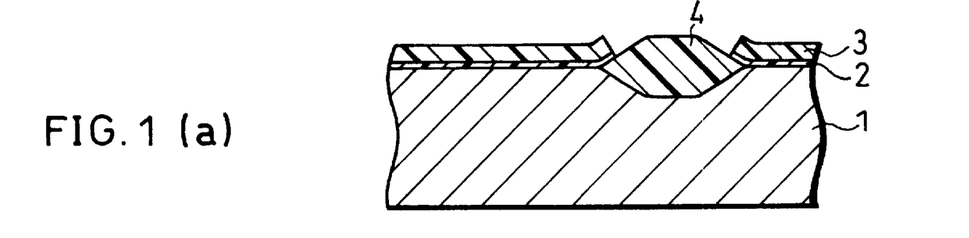
FIGS. 1(a) through 1(d) are cross-sectional views illustrating a manufacturing process of a semiconductor device in accordance with one embodiment of the present invention.

To start with, as illustrated in FIG. 1(a), the pad oxide film 2 is deposited on the P-type semiconductor substrate (or, P-type well) 1 so as to be 200 Å to 300 Å thick (its optimal thickness is about 280 Å), and the silicon nitride film 3 is deposited thereon so as to be 1500 Å to 2500 Å thick (its optical thickness is about 2000 Å). An element isolating region is formed by photoetching techniques, and the field oxide film 4 is grown therein. A thickness of the field oxide film 4 should be determined based on inherent characteristics of the field oxide film 4, but in the present embodiment the thickness is set to 4000 Å to 6000 Å (its optical thickness is 5000 Å). Conditions for field oxidation are not specifically set, but in the present embodiment, wet oxidation at 1100° C. is applied.

Subsequently, as illustrated in FIG. 1(b), the pad oxide film 2 and the silicon nitride film 3 are removed, and the channel stopper implantation is applied. Herein, ions of boron are implanted at an accelerating energy of 140 keV to 180 keV (its optimal accelerating energy is about 160 keV) by a dose quantity of about $2\times10^{12}$ cm$^{-2}$ to $4\times10^{12}$ cm$^{-2}$ (its optimal dose quantity is $3\times10^{12}$ cm$^{-2}$).

Figure 2A:
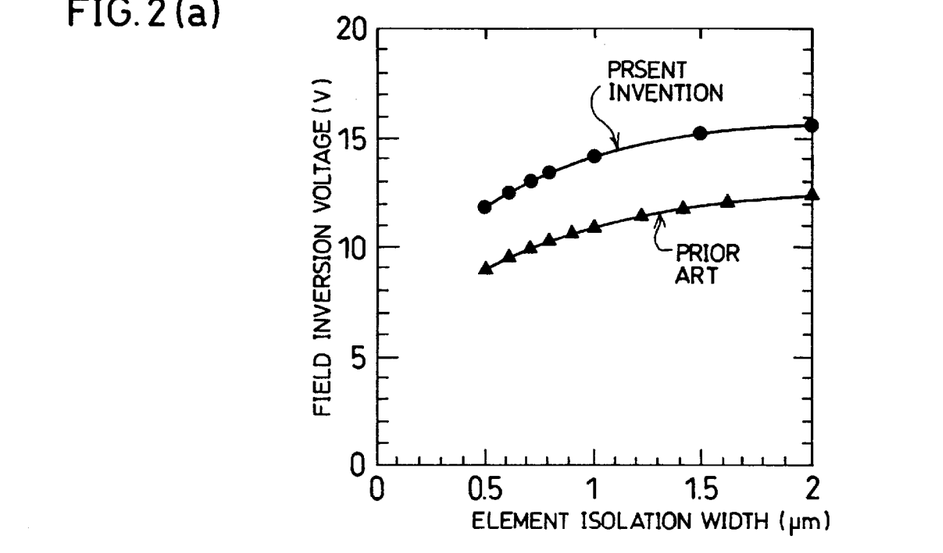
FIG. 2(a) is a graph illustrating a correlation between an element isolation width and a field inversion voltage in the present invention and that in a conventional case.
Figure 2B:
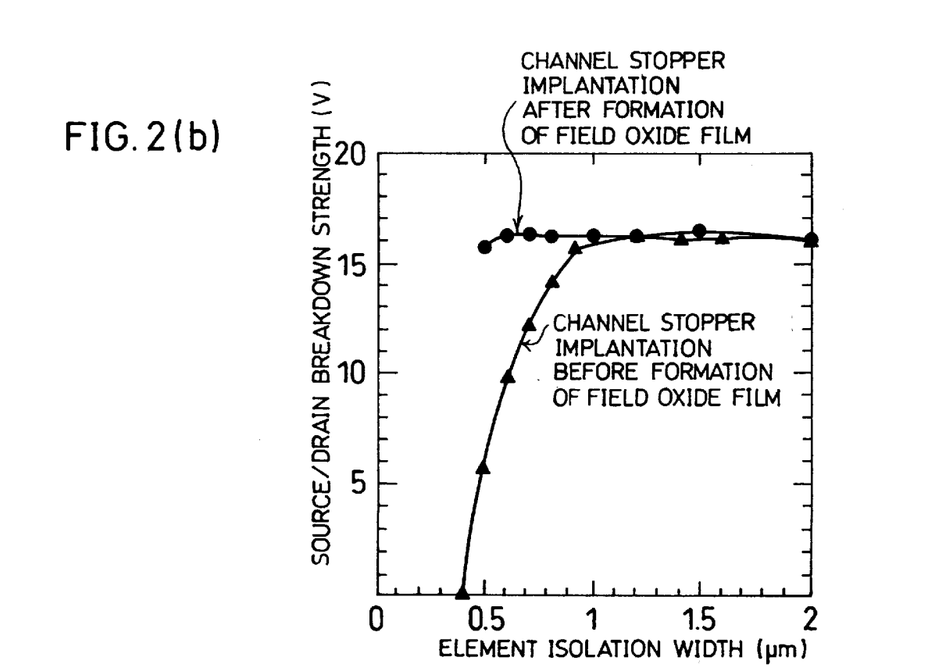
FIG. 2(b) is a graph illustrating a correlation between the element isolation width and source/drain breakdown strength in the case where channel stopper implantation is carried out before formation of a field oxide film, and that in the case where the channel stopper implantation is carried out after the formation of the field oxide film.
Figure 5A:
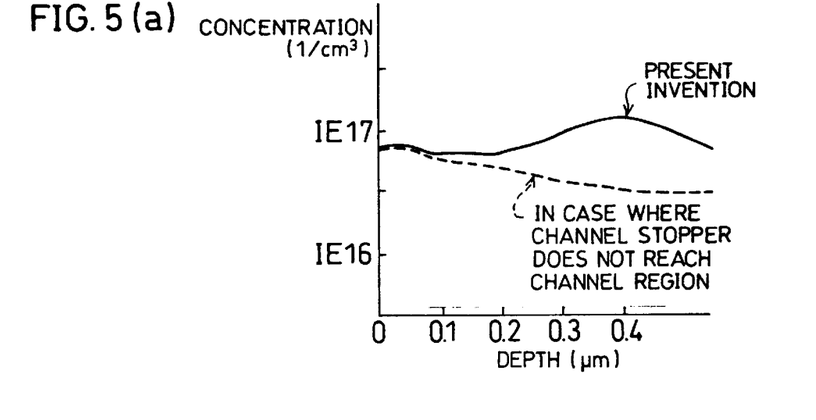
FIG. 5(a) is a graph illustrating impurity concentration distribution in a substrate depth direction in a channel region in the present invention, and that in the case where the channel stopper does not reach the channel region.
Figure 5B:
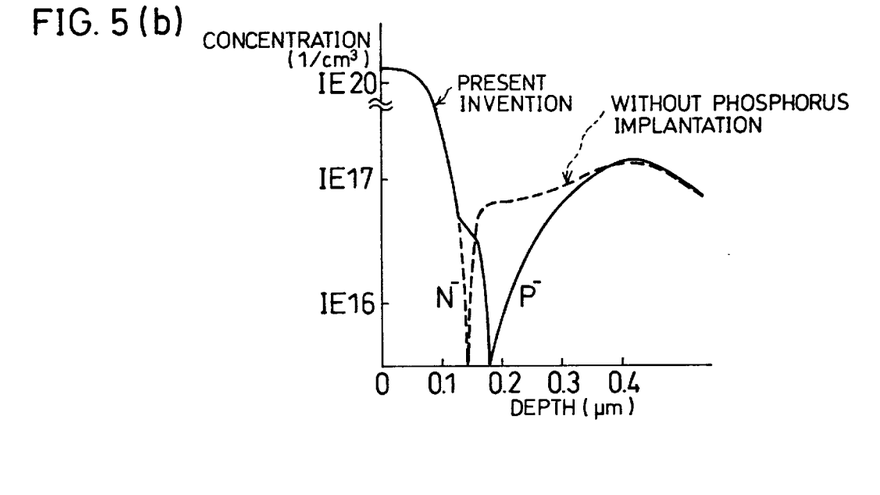
FIG. 5(b) is a graph illustrating impurity concentration distribution in a substrate depth direction in the source/drain region in the present invention, and that in a conventional case wherein phosphorus implantation is not carried out.
Figure 5C:
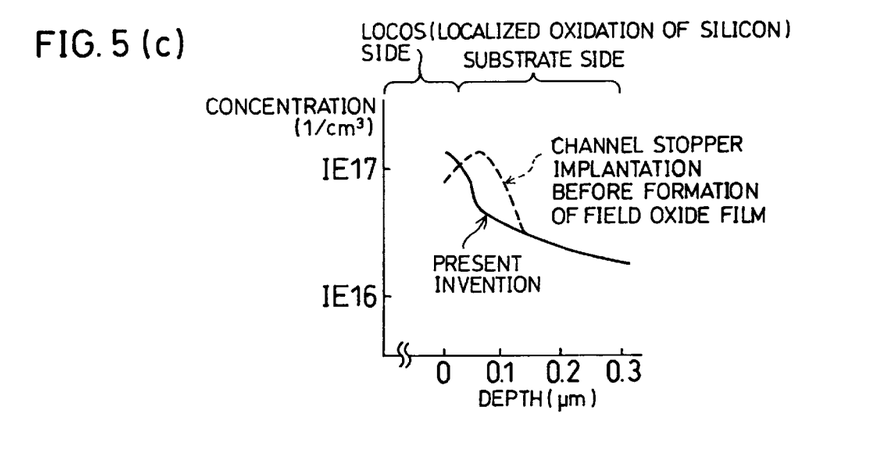
FIG. 5(c) is a graph illustrating impurity concentration distribution in a substrate depth direction in the field oxide film in the present invention and that in the case where the channel stopper implantation is carried out before the formation of the field oxide film.

Here, as shown in FIG. 5(c) it is preferable to implant ions of boron so that an impurity concentration in a part just under the field oxide film 4 becomes higher than those in deeper parts of the P-type semiconductor substrate. In this case, as illustrated in FIG. 2(a), a field inversion voltage is increased, as compared with conventional cases. Besides, as illustrated in FIG. 6 (b), at the accelerating energy of 160 keV, the junction breakdown strength decreases while the field inversion voltage increases, as the dose quantity of boron ions increases. Further, in the present embodiment, the channel stopper implantation is applied after the formation of the field oxide film 4, and accordingly, as illustrated in FIG. 2(b), in the case where a width of the element isolating region (hereinafter referred to as element isolation width) is narrow, improvement of the source-drain breakdown strength is observed, as compared with the case where the channel stopper implantation is carried out before the formation of the field oxide film.

Next, as illustrated in FIG. 1(c), a MOS FET is formed by a usual method. To describe in detail, the gate oxide film 6 is formed, the date electrode 7 is formed thereon, an N-type impurity (impurity having second conductivity) are implanted, and an annealing at 900° C. is applied for about 60 minutes for activating the impurity, so that the N-type diffusion layers 8 as source/drain regions are formed.

Note that in the present embodiment, the gate oxide film 6 is formed by oxidation with hydrochrolic acid so as to be 120 Å to 160 Å thick. The gate electrode 7 has a two-layer structure, composed of a layer of polysilicon doped with phosphorus with a thickness of about 1500 Å and a layer of tangusten silicide with a thickness of about 1000 Å. It is appropriate to form the N-type diffusion layers 8 to serve as the source/drain regions by implanting the N-type impurity at an accelerating energy of 30 keV to 50 keV by a dose quantity of about $1\times10^{15}$/cm$^2$ to $5\times10^{15}$/cm$^2$. However, conditions of the method of the present invention should not be limited to those described above, and it can be applied to any transistor structures provided that it is a MOS FET, including the LDD (lightly doped drain) structure.

In cases of certain desired threshold voltages, only the channel stopper implantation should be carried out. Moreover, implantation of boron ions at 10 keV may be applied as channel implantation to the channel region, by using the same mask (for example, a resist mask) as that used during the channel stopper implantation. In this case, the number of masks can be reduced.

Note that the boron implantation layer 5b to serve as the channel stopper layer is extended by the annealing for activating the N-type diffusion layers 8, and has a distribution shown in FIG. 1(d). Therefore, as shown in FIG. 5(a), influences of boron thus implanted are exerted even to a region just under the channel (a region with a depth of 0 to 0.1 µm, which may affect the threshold voltage), and the threshold voltage increases due to some concentration of boron. Therefore, the dose quantity of boron for channel implantation may be considerably less than the dose quantity required in the conventional cases. Further, FETs having different threshold voltages can be obtained, in the case where the channel region of the N-ch MOS FET is masked when forming the channel stopper layer and in the case where it is not masked.

Next, as illustrated in FIG. 1(d), ion implantation of phosphorus (second-conductivity-type impurity) is carried out at an accelerating energy of 80 keV to 120 keV by a dose quantity of about $3\times10^{12}$/cm$^2$ to $7\times10^{12}$/cm$^2$. Herein, it is preferable that an impurity concentration peaks come just under the N-type diffusion layers 8 which serve as source/drain regions, though at least it is required that the N-type diffusion layer 8 is formed so as to be in contact with the P-type phosphorus implantation layer 9, which has an impurity concentration lower than that of the boron implantation layer 5b as the channel stopper layer. This results in cutoff of the boron implantation layer 5b as the channel stopper layer having a high impurity concentration, right under the N-type diffusion layers 8 as the source/drain regions. Therefore, as illustrated in FIG. 5(b), the vicinity of the region where the N-type diffusion layer 8 and the phosphorus implantation layer 9 come into contact (about 0.1 µm to 0.2 µm deep) has a smooth and gradual concentration changes. Moreover, by arranging the impurity concentration peak so as to come to right under the N-type diffusion layer 8, the concentration changes more gradually. Therefore, the problems such as an increase in the junction capacitance and lowering of the junction breakdown strength are also eliminated.

Figure 6A:
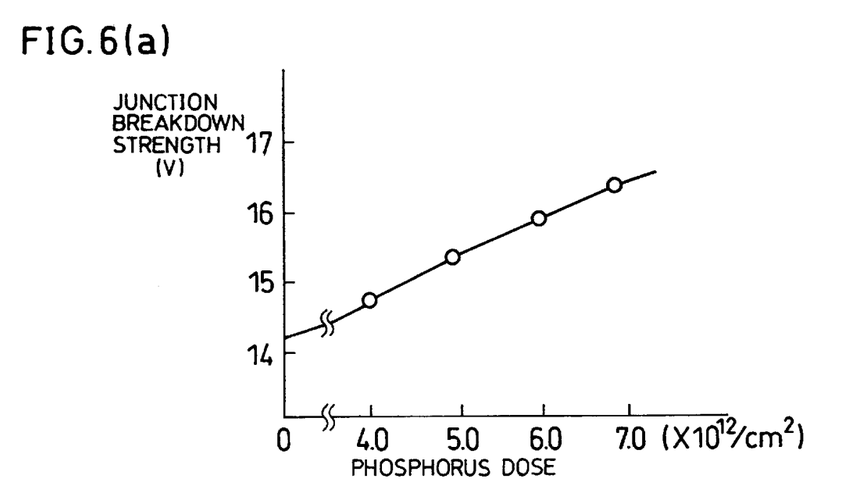
FIG. 6(a) is a graph illustrating a correlation between a dose quantity of phosphorus and a junction break down strength.
Figure 6B:
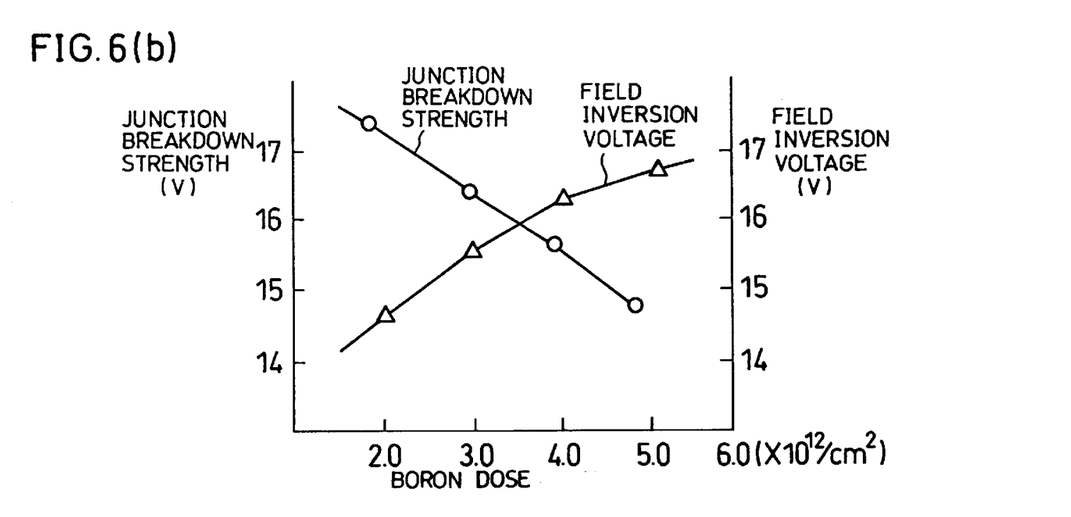
FIG. 6(b) is a graph illustrating a correlation between a dose quantity of boron, junction breakdown strength, and a field inversion voltage.

Note that, as illustrated in FIG. 6(a), as the dose quantity of implanted phosphorus at an accelerating energy of 100 keV increases, the junction breakdown strength improves. On the other hand, if the dose quantity of implanted phosphorus exceeds $10^{13}$/cm$^2$, the element isolation breakdown strength is reversely affected. Therefore, it is preferable that the dose quantity of phosphorus falls in the aforementioned range ($3\times10^{12}$/cm$^2$ to $7\times10^{12}$/cm$^2$). In addition, as is the implantation for forming the N-type diffusion layer 8, the phosphorus implantation is carried out only with respect to a region where N-type diffusion layer 8 is formed, with the gate electrode 7 and the field oxide film 4 used as a mask.

Figure 3:
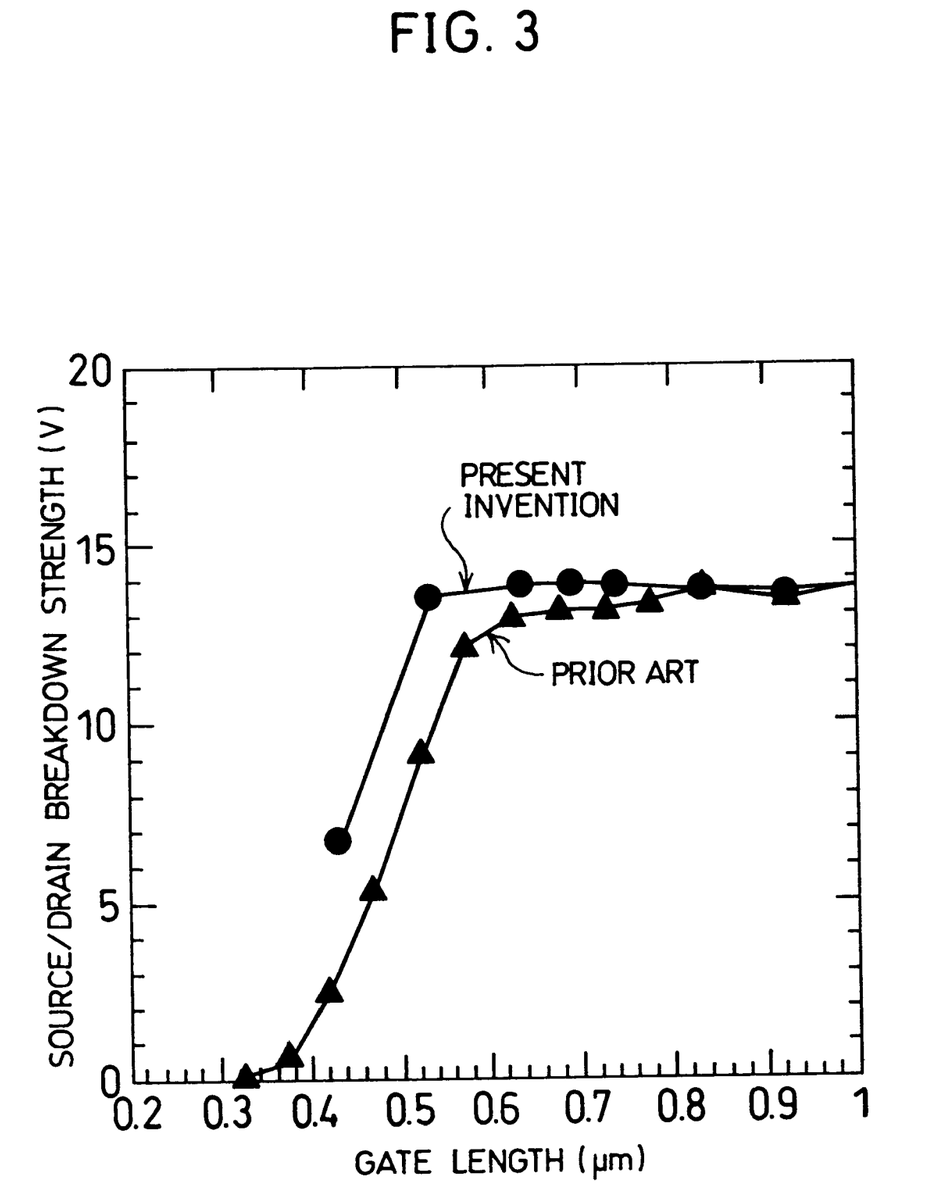
FIG. 3 is a graph illustrating a correlation between a gate length and the source/drain breakdown strength in the present invention and that in a conventional case.

By the present invention as described above, the boron implanted in the active region during the channel stopper layer formation functions, under the channel, as a punch-through stopper in the source/drain regions. Therefore, there is no need to form a punch-through stopper layer through channel implantation, and as a result a quantity of channel implantation is reduced. Besides, in the present embodiment, a short channel effect did not occur even in the case where the gate length is shortened by 0.1 µm, as illustrated in FIG. 3.

Figure 4:
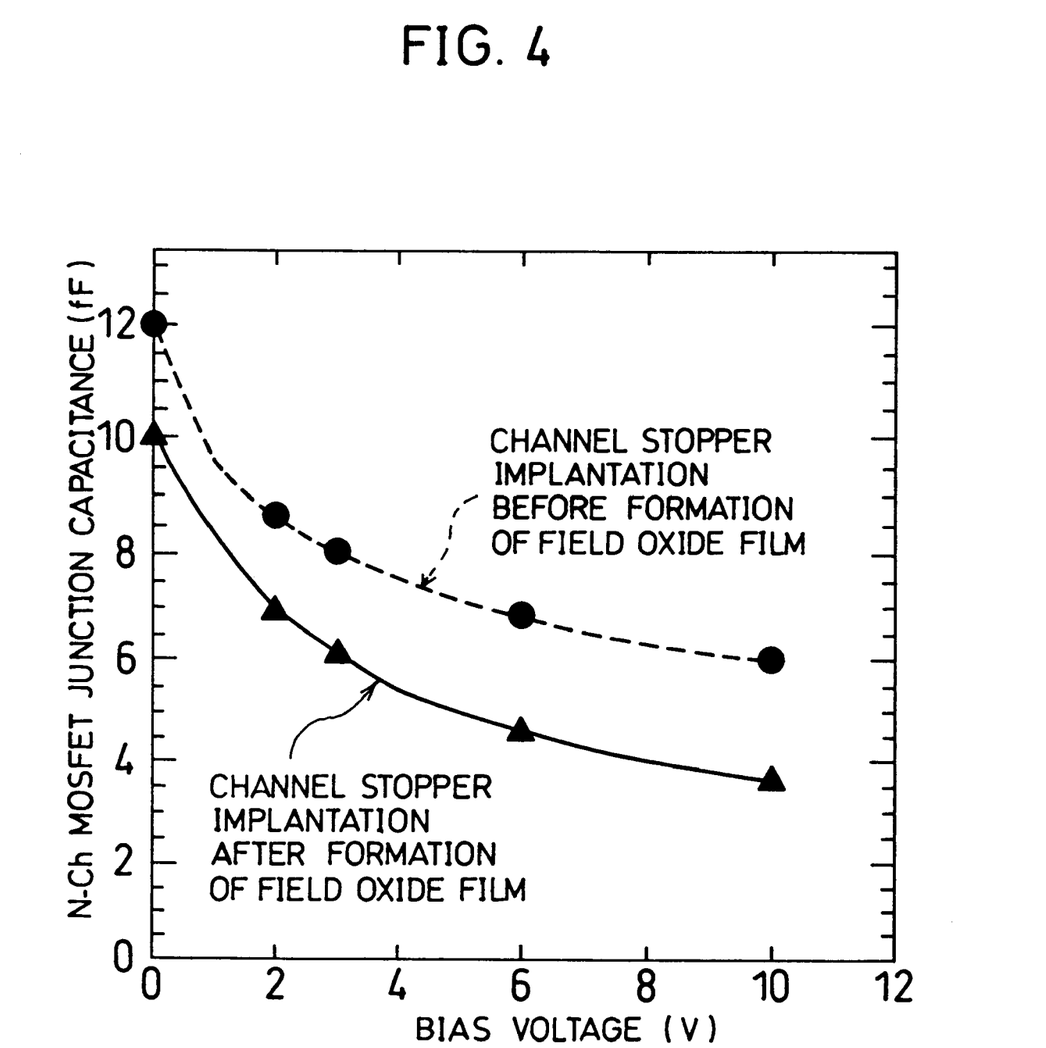
FIG. 4 is a correlation between a bias voltage and a junction capacitance of an N-ch MOS FET in the case where the channel stopper implantation is carried out before the formation of the field oxide film, and that in the case where the channel stopper implantation is carried out after the formation of the field oxide film.

Further, right under the source/drain regions, an increase in the junction capacitance can be avoided by the phosphorus implantation. Besides, as illustrated in FIG. 4, a junction capacitance in the case where the channel stopper implantation is carried out after the formation of the field oxide film 4 is lower than that in the case where the channel stopper implantation is carried out before the formation of the field oxide film 4, since a P-type impurity concentration right under the source/drain regions and in neighboring parts in the former case is lower than that in the latter case. Therefore, with the present invention, the junction capacitance as a whole is drastically reduced.

Thought the description of the present embodiment exemplified an N-ch MOS FET, but the present invention is applicable to a P-ch MOS FET.

As has been described, the semiconductor device manufacturing method of the present invention is characterized in comprising the steps of (a) forming a field oxide film either on a semiconductor substrate having first conductivity or on a well having the first conductivity, (b) carrying out ion implantation of a first impurity having the first conductivity with respect to a whole surface so as to form a channel stopper layer under the field oxide film, and thereafter, forming a MOS FET in an active region either in the semiconductor substrate or in the well, and (c) carrying out ion implantation of a second impurity having the first conductivity at a set accelerating energy by a set dose quantity, by using the gate electrode of the MOS FET and the field oxide film as a mask, so that an impurity layer having the same type of conductivity as that of the channel stopper layer and a concentration lower than that of the channel stopper layer is formed right under the source/drain regions of the MOS FET between the source/drain regions and the channel stopper layer.

By the aforementioned method, the channel stopper implantation is carried out through the field oxide film, and since the method does not have a step of etching back a field oxide film with a thickness exceeding an intended thickness so that the field oxide film has an intended thickness, no dimensional change occurs to the field oxide film.

Besides, since in the source/drain region, the influence of the impurity concentration in the channel stopper layer is reduced with the use of the impurity which has the same type of conductivity as the ion implanted in the active region for forming the channel stopper layer and a concentration lower than that of the ion for the channel stopper layer, the junction capacitance can be decreased right under the source/drain regions.

Thus, by the aforementioned method such advantages resulting from carrying out the formation of the channel stopper layer after the formation of the field oxide film are maintained, problems that the prior art has are prevented, an increase in the junction capacity is restrained, and the a short channel effect is also prevented.

Furthermore, it is preferable that the ion implantation of the second impurity having the first conductivity is carried out at a set accelerating energy so that the impurity concentration peak comes substantially right under the source/drain region. By doing so, an increase in the junction capacitance and lowering of the junction breakdown strength are surely avoided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device, comprising the steps of:

forming a field oxide film either on a first-conductivity-type semiconductor substrate or on a first-conductivity-type well;

performing ion implantation of a first-conductivity-type impurity with respect to a whole surface to form a channel stopper layer under the field oxide film, and subsequently forming a MOSFET having a gate electrode, a source region, and a drain region in an active region either in the semiconductor substrate or in the well; and performing ion implantation of a second-conductivity-type impurity using the gate electrode of the MOSFET and the field oxide film as a mask, so that impurity layers having the same type of conductivity as that of the channel stopper layer and a concentration lower than that of the channel stopper layer are formed right under the source region and the drain region of the MOSFET between the source and drain regions and the channel stopper layer, wherein the impurity concentration peaks of the second-conductivity-type impurity come substantially right under the source and drain regions.

2. The manufacturing method as set forth in claim 1, further comprising:

performing channel implantation to obtain a desired threshold voltage for the MOSFET using the same mask as that used in the ion implantation for forming the channel stopper layer.

3. The manufacturing method as set forth in claim 1, wherein the ion implantation of the second-conductivity-type impurity is carried out so that the impurity layers are formed in contact with the source and drain region.

4. The manufacturing method as set forth in claim 1, wherein the ion implantation of the second-conductivity-type impurity is carried out by a dose quantity of $3\times10^{12}/cm^2$ to $7\times10^{12}/cm^2$.

5. A method of manufacturing a semiconductor device, comprising the steps of:

forming a field oxide film either on a first-conductivity-type semiconductor substrate or on a first-conductivity-type well;

performing ion implantation of a first-conductivity-type impurity with respect to a whole surface to form a channel stopper layer under the field oxide film, and subsequently forming a MOSFET having a gate electrode, a source region, and a drain region in an active region either in the semiconductor substrate or in the well wherein an impurity concentration of a part right under the field oxide film is higher than in deeper parts, either in the semiconductor substrate or in the well; and performing ion implantation of a second-conductivity-type impurity using the gate electrode of the MOSFET and the field oxide film as a mask, so that impurity layers having the same type of conductivity as that of the channel stopper layer and a concentration lower than that of the channel stopper layer are formed right under the source region and the drain region of the MOSFET between the source and drain regions and the channel stopper layer.

6. The manufacturing method as set forth in claim 5, further comprising:

performing channel implantation to obtain a desired threshold voltage for the MOSFET using the same mask as that used in the ion implantation for forming the channel stopper layer.

7. The manufacturing method as set forth in claim 5, wherein the ion implantation of the second-conductivity-type impurity is carried out so that the impurity layers are formed in contact with the source and drain region.

8. The manufacturing method as set forth in claim 5, wherein the ion implantation of the second-conductivity-type impurity is carried out by a dose quantity of $3\times10^{12}/cm^2$ to $7\times10^{12}/cm^2$.

9. A semiconductor device comprising:

either a first-conductivity-type semiconductor substrate or a first-semiconductor-type well;

a field oxide film formed in an element isolating region of either said substrate or said well;

a channel stopper layer formed by ion implantation of a first-conductivity-type impurity;

a MOSFET having at least a source region and a drain regions said MOSFET being formed in an active region of either said semiconductor substrate or said well; and impurity layers formed by ion implantation of a second-conductivity-type impurity right under the source and drain regions between the source and drain regions and said channel stopper layer, so that said impurity layer has the same type of conductivity as that of said channel stopper layer and has a concentration lower than that of said channel stopper layer, wherein impurity concentration peaks of the second-impurity-type impurity come substantially right under the source and drain regions.

10. The semiconductor device as set forth in claim 9, wherein said impurity layers are formed in contact with the source and drain region.

11. A semiconductor device comprising:

either a first-conductivity-type semiconductor substrate or a first-semiconductor-type well;

a field oxide film formed in an element isolating region of either said substrate or said well;

a channel stopper layer formed by ion implantation of a first-conductivity-type impurity, wherein said channel stopper layer is arranged so that an impurity concentration of the first-conductivity-type impurity in a part right under said field oxide film is higher than in deeper parts, either in said semiconductor substrate or in said well;

a MOSFET having at least a source region and a drain region, said MOSFET being formed in an active region of either said semiconductor substrate or said well; and impurity layers formed by ion implantation of a second-conductivity-type impurity right under the source and drain regions between the source and drain regions and said channel stopper layer so that said impurity layer has the same type of conductivity as that of said channel stopper layer and has a concentration lower than that of said channel stopper layer.

12. The semiconductor device as set forth in claim 11, wherein said impurity layers are formed in contact with the source and drain region.

13. A semiconductor device comprising:

either a first-conductivity-type semiconductor substrate or a first-semiconductor-type well;

a field oxide film formed in an element isolating region of either said substrate or said well;

a channel stopper layer of the first-semiconductor-type;

a MOSFET having at least a source region and a drain region, said MOSFET being formed in an active region of either said semiconductor substrate or said well; and impurity layers of a second-conductivity-type impurity right under the source and drain regions between the source and drain regions and said channel stopper layer, so that said impurity layer has the same type of conductivity as that of said channel stopper layer and has an impurity concentration lower than that of said channel stopper layer, wherein impurity concentration peaks of the second-impurity-type impurity come substantially right under the source and drain regions.

14. A semiconductor device comprising:

either a first-conductivity-type semiconductor substrate or a first-semiconductor-type well;

a field oxide film formed in an element isolating region of either said substrate or said well;

a channel stopper layer of a first-conductivity-type impurity, wherein said channel stopper layer is arranged so that an impurity concentration of the first-conductivity-type impurity in a part right under said field oxide film is higher than in deeper parts, either in said semiconductor substrate or in said well;

a MOSFET having at least a source region and a drain region, said MOSFET being formed in an active region of either said semiconductor substrate or said well; and impurity layers of a second-conductivity-type impurity right under the source and drain regions between the source and drain regions and said channel stopper layer, so that said impurity layer has the same type of conductivity as that of said channel stopper layer and has an impurity concentration lower than that of said channel stopper layer.

* * * * *